(12) United States Patent
Uchino

(10) Patent No.: US 7,466,251 B2
(45) Date of Patent: Dec. 16, 2008

(54) TIME-INTERLEAVED A/D CONVERTER DEVICE

(75) Inventor: Shinichi Uchino, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/819,747

(22) Filed: Jun. 28, 2007

(65) Prior Publication Data

US 2008/0001806 A1  Jan. 3, 2008

(30) Foreign Application Priority Data

Jun. 29, 2006  (JP) ............................. 2006-179685

(51) Int. Cl.
*H03M 1/10* (2006.01)

(52) U.S. Cl. ...................... 341/120; 341/155
(58) Field of Classification Search ................ 341/120, 341/118, 155; 375/354, 355
See application file for complete search history.

(56) References Cited

U.S. PATENT DOCUMENTS

| 6,614,856 B1 * | 9/2003 | Meyer | 375/316 |
| 7,012,983 B2 * | 3/2006 | Buchwald et al. | 375/373 |
| 7,245,638 B2 * | 7/2007 | Agazzi et al. | 370/516 |

FOREIGN PATENT DOCUMENTS

JP  11-195988  7/1999

OTHER PUBLICATIONS

Jin, Huawen and Lee, Edward K.F., "A Digital-Background Calibration Technique for Minimizing Timing-Error Effects in Time-Interleaved ADC's", Circuit Systems II: Analog and Digital Signal Processing, IEEE Transactions on, vol. 47, Issue 7, Jul. 2000, pp. 603-613.

Yosiro, Miida, "Numerical Calculation Method", Morikita Publishing, Co., Ltd., 1991, pp. 26-30.

* cited by examiner

Primary Examiner—Peguy JeanPierre
(74) Attorney, Agent, or Firm—McGinn IP Law Group, PLLC

(57) ABSTRACT

Disclosed is a time-interleaved A/D converter device that including first and second digital filters that respectively perform filter processing on output signals of first and second A/D converter circuits driven by first and second clocks, respectively, an interpolator that receives an output signal of the first digital filter and derives an interpolation value corresponding to a case where an input signal is sampled using the second clock signal free of a clock skew and having a predetermined phase relationship with respect to the first clock signal, a phase comparison circuit that receives the output of the first digital filter, an output of the second digital filter, and an interpolation signal from the interpolator, and outputs a first signal indicating a phase advance or a phase delay of the second signal responsive to a gradient of the input signal and a second signal indicating whether the output signal of the second digital filter matches the interpolation signal or not, a digital filter that receives the first and second signals output from the phase comparison circuit, and outputs zero when the second signal indicates a match and outputs a polarity of a value obtained b by selecting a positive value or a negative value according to the delay or advance indicated by the first signal and averaging selected values when the second signal indicates a mismatch, and a variable delay circuit that receives an output of the digital filter and changes a delay time of the second clock signal.

9 Claims, 11 Drawing Sheets

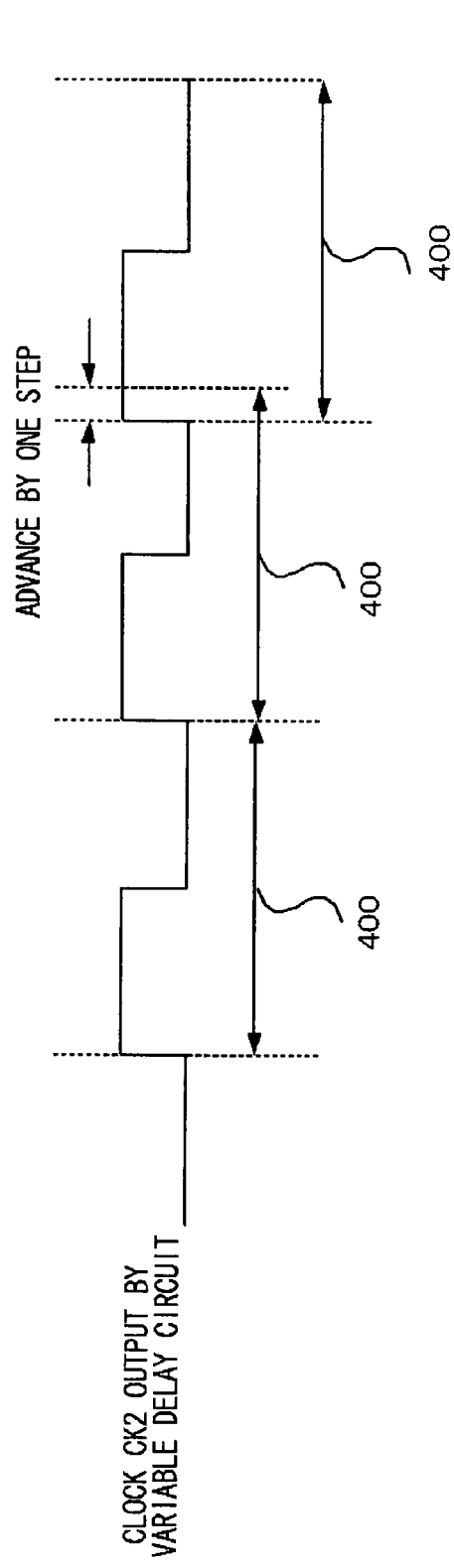
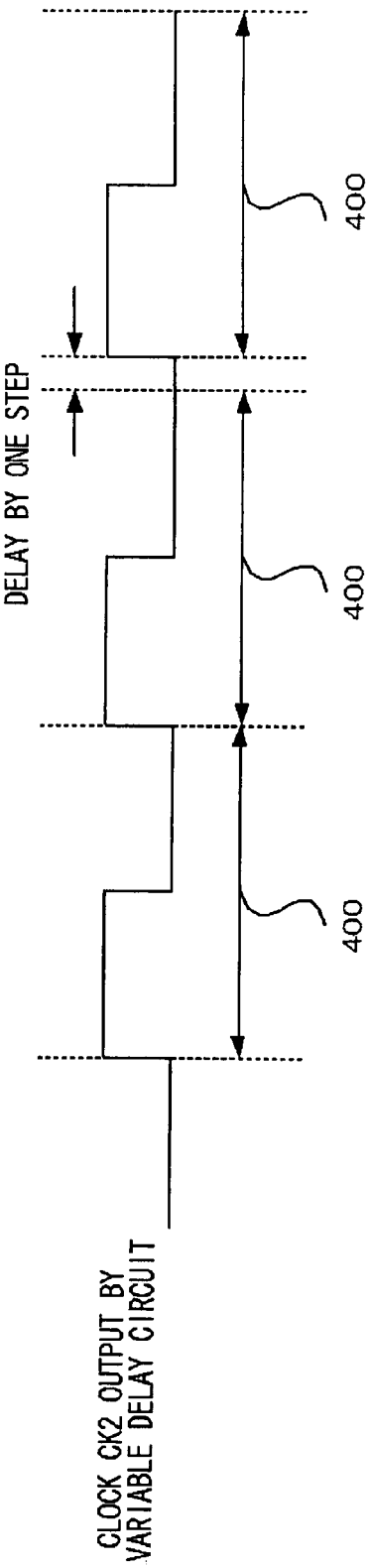

TIME-INTERLEAVED A/D CONVERTER DEVICE

RELATED APPLICATION

This application is based upon and claims the benefit of priority from Japanese patent application No. 2006-179685, filed on Jun. 29, 2006, the disclosure of which is incorporated herein in its entirety by reference.

FIELD OF THE INVENTION

The present invention relates to a time-interleaved A/D converter device. More specifically, the invention relates to a time-interleaved A/D converter device that allows automatic adjustment of a skew of a clock signal.

BACKGROUND OF THE INVENTION

Recently, signal processing in applications of data communications or the like has been remarkably sped up. Accompanying this faster signal processing, faster conversion of an A/D (Analog to Digital) converter circuit is demanded. A highly accurate A/D conversion with a wide dynamic range is also demanded.

As one of measures for the demands as described above, a time-interleaved A/D converter device, in which two or more A/D converter circuits are disposed in parallel, is employed.

FIG. 8 is a diagram showing a typical configuration of the interleaved A/D converter device that uses the two A/D converter circuits. FIG. 9 is a timing diagram explaining an operation of a circuit in FIG. 8. A first A/D converter circuit $1_1$ and a second A/D converter circuit $1_2$ use clocks (CK1, CK2) with phases thereof shifted by 180 degrees as sampling clocks, respectively, and performs A/D conversion of an input signal. Frequencies (sampling frequencies) of the respective sampling clocks (CK1, CK2) are the same. A selector (also referred to as an "ADC output selector") 10 performs switching between converted outputs (digital signals) of the first A/D converter circuit $1_1$ and a second A/D converter circuit $1_2$, thereby implementing the A/D converter device with a sampling frequency thereof twice as large as each of the sampling frequencies of the clock (CK1, or CK2).

FIG. 8 shows an example in which the first A/D converter circuit $1_1$ and the second A/D converter circuit $1_2$ are arranged in parallel. Assume that the number of A/D converter circuits used in parallel is set to M. When the A/D converter device of a predetermined sampling frequency is implemented, respective sampling frequencies of the A/D converter circuits arranged in parallel can be reduced to 1/M. That is, by arranging a plurality of low-speed A/D converter circuits in parallel, and driving the low-speed A/D converter circuits by multiphase clocks, respectively, a high-speed A/D converter device can be implemented. Design of the A/D converter circuit itself therefore is facilitated.

However, this method has a problem that when a phase difference between the clocks for the A/D converter circuits used in parallel is not accurate, a spurious may occur in an A/D converted output, thereby deteriorating an SFDR (Spurious Free Dynamic Ratio) characteristic (refer to Non-patent Document 1).

A phase difference deviation between clocks, or a clock skew is generated due to buffering of a clock to be supplied from a clock generator to each A/D converter circuit, a wiring layout, a change in an environment such as temperature, and manufacturing variations. A method of reducing the clock skew that may cause serious characteristic deterioration therefore becomes necessary.

In order to improve an influence of the clock skew, there are proposed a plurality of approaches, in which A/D converter circuits are initially calibrated. Non-patent Document 1, for example, discloses a configuration in which a Ramp signal is used as a calibration signal, and the clock skew is corrected based on a result of conversion and an ideal conversion value.

Patent Document 1 discloses a configuration in which a clock is A/D converted, information on an advance or a delay in the clock is extracted from an MSB of a result of the conversion, and a variable delay is controlled, thereby adjusting the clock skew. This Patent Document 1 discloses a configuration of a time-interleaved A/D converter device in which a plurality of A/D converters are arranged in parallel, and operations of the respective A/D converters are time-interleaved. The time-interleaved A/D converter device includes first and second analog (digital) delay time synchronization loop circuits, and clock signals to be supplied to first and second A/D converters, respectively, are synthesized. A configuration in which delay control is performed by analog circuits (that perform D/A conversion) (in the analog delay time synchronization loop circuits) and a configuration in which the delay control is performed by digital circuits (each formed of a counter and a digital filter) (in the digital delay time synchronization loop circuits) are disclosed. Since the analog circuits and the digital circuits are different just in a manner in which a variable delay is controlled, a configuration of the digital circuits will be described below.

FIG. 10 is a diagram showing a configuration of the digital delay time synchronization loop circuits. Operation timings with respect to skew adjustment in the configuration in FIG. 10 are shown in FIGS. 11A, 11B, and 11C, respectively. FIG. 11A shows a case where a first variable delay circuit (18) is longer than a first delay circuit (20). FIG. 11B shows a case where the first variable delay circuit (18) is shorter than the first delay circuit (20). FIG. 11C shows an A/D conversion clock S110, a second A/D converter input S111, a first clock CK1 (S112), an MSB (Most Significant Bit) of an output (S113) of the first A/D converter circuit 14.

Referring FIG. 10, after an input switch (Switch) 13 has been switched to a B side and the A/D conversion clock S110 has been delayed by the first variable delay circuit (18), the A/D conversion clock S110 is input to a first A/D converter circuit 14 and a second A/D converter circuit 15. Then, using results of A/D conversion, the variable delay circuit 18 and a variable delay circuit 21 are adjusted, thereby adjusting a timing between the clock CK1 for the first A/D converter circuit 14 and a clock CK2 for the second A/D converter circuit 15. After timing adjustment (after there is no skew), the input switch 13 is switched to an A side. A first A/D converter input S100 is then input to the first and second conversion circuits 14 and 15 through the switch 13, and the time-interleaved A/D converter device operates as a usual A/D converter device.

Next, control over a variable delay will be described. The variable delay circuit 18 is controlled as follows.

The first A/D converter circuit 14 A/D converts the first A/D converter input S111 obtained by delaying the A/D conversion clock S110 by the variable delay circuit 18, using the clock CK1, and the MSB (S113) of a result of the conversion is counted by an UP/DOWN counter 37.

After results of the count by the UP/DOWN counter 37 are smoothed by a first digital filter (38), a smoothed value is input to the first variable delay circuit (18), thereby controlling a delay of the first variable delay circuit (18).

Until the second A/D converter input S11 and the clock CK1 are synchronized as shown in FIG. 11C, control over the first variable delay circuit (18) is repeated.

The UP/DOWN counter 37 performs an UP operation when the MSB (S113) of the output of the first A/D converter circuit 14 is one, and performs a DOWN operation when the MSB is zero.

When a digital value of the control signal decreases (when a count value of the UP/DOWN counter 37 decreases and an output digital value of the first digital filter (38) thereby decreases), a delay of the first variable delay circuit (18) decreases. When the digital value of the control signal increases (when the count value of the UP/DOWN counter 37 increases and the output digital value of the first digital filter (38) thereby increases), the delay of the first variable delay circuit (18) increases.

When a delay time of the first variable delay circuit (18) is longer than that of the delay circuit 20, as shown in FIG. 1A, the MSB (S113) of the output of the first A/D converter circuit 14 obtained using the clock CK1 becomes zero. When this result is accumulated and added by the UP/DOWN counter 37, the output of the UP/DOWN counter 37 gradually decreases.

For this reason, the delay time of the first variable delay circuit (18) decreases. Then, as shown in FIG. 11C, the second A/D converter input (S111) and the clock CK1 (S112) are finally synchronized.

On the other hand, as shown in FIG. 11B, when the delay time of the variable delay circuit 18 is shorter than that of the delay circuit 20, a reverse operation will be performed. That is, the MSB (S113) of the output of the first A/D converter circuit 14 obtained using the clock CK1 becomes one. When this result is accumulated and added by the UP/DOWN counter 37, the output of the UP/DOWN counter 37 gradually increases. For this reason, the delay time of the variable delay circuit 18 increases, and as shown in FIG. 11C, the second A/D converter input (S111) and the clock CK1 (S112) are finally synchronized.

The second variable delay circuit (21) is controlled by an UP/DOWN counter 40 that receives an output of the second A/D converter circuit 15 and a second digital filter (41) that averages outputs of the UP/DOWN counter 40. The second variable delay circuit (21) is controlled by a mechanism that is the same as for the first variable delay circuit (18).

Since a phase of the clock CK2 for the second A/D converter circuit 15 is different from a phase of the clock CK1 for the first A/D converter circuit 14 by 180 degrees, an UP/DOWN operation of the UP/DOWN counter 40 becomes reverse to that of the UP/DOWN counter 37.

Processing on the second variable delay circuit (21) is performed until the second A/D converter input (S111) and the clock CK2 (S115) are synchronized as shown in FIG. 11C.

After the control over the first variable delay circuit (18) has been completed, a phase relationship between the clock CK1 (S112) and the clock CK2 (S115) becomes a difference of 180 degrees.

[Non-Patent Document 1]
Huawen Jin, Lee, E. K. F. "A digital-background calibration technique for minimizing timing-error effects in time-interleaved ADCs," Circuits and Systems II: Analog and Digital Signal Processing, IEEE Transactions on [see also Circuits and Systems II: Express Briefs, IEEE Transactions on] Volume 47, Issue 7, July 2000 Page(s): 603-613

[Non-Patent Document 2]
Miida Yosiro, "Numerical Calculation Method", pp. 26-30, Morikita Publishing Co., Ltd., 1991

[Patent Document 1]
JP Patent Kokai Publication No. JP-A-11-195988

SUMMARY OF THE DISCLOSURE

In an approach described in the Non-patent Document 1 described above, addition of analog circuits or the like is necessary in order to calibrate the clock skew.

The configuration of Patent Document 1 shown in FIG. 10 is based on following assumptions:

(a1) that the input switch (S/W) is provided for inputs to the A/D converter circuits in order to adjust the clock skew, thereby performing switching between adjustment and a usual operation;

(a2) that the input signal dedicated to the adjustment is used for adjusting the clock skew; and (a3) that when continuous A/D conversion processing is performed, a delay is completely adjusted at a time of the adjustment of the clock skew, and that readjustment is not necessary after the clock skew adjustment.

For this reason, the following problems, for example, will arise.

(b1) Since characteristics of the added switch (S/W) influence characteristics of the A/D converter circuits, design of analog circuits becomes difficult.

(b2) Until the clock skew has been adjusted, A/D conversion cannot be performed.

(b3) After phase adjustment, the time-interleaved A/D converter device is fixed by a result of the adjustment. Accordingly, the time-interleaved A/D converter device cannot follow a change in the clock skew caused by temperature, voltage, and aged deterioration.

In order to solve the problems described before, the invention disclosed in this application is generally configured as follows:

A time-interleaved A/D converter device according to one aspect (aspect) of the present invention includes:

first and second A/D converter circuits arranged in parallel with each other, said first and second A/D converter circuits receiving first and second clock signals having a predetermined phase relationship therebetween, respectively, and operating a time-interleaved manner; and a phase adjustment circuit provided corresponding to said first and second A/D converter circuits;

wherein said phase adjustment circuit includes an interpolator that derives an interpolation value corresponding to a case where an input signal is sampled using a second clock signal which is free of a clock skew and has the predetermined phase relationship with respect to the first clock signal, based on an output sequence of said first A/D converter circuit that samples the input signal using the first clock signal; and said phase adjustment circuit controls a phase of the second clock signal so that an actual output of said second A/D converter circuit becomes close to the interpolation value or matches the interpolation value, based on the actual output of said second A/D converter circuit and the interpolation value.

In the present invention, there is provided a time-interleaved A/D converter device including first and second A/D converter circuits arranged in parallel with each other, the first and second A/D converter circuits receiving first and second clock signals having a predetermined phase relationship, respectively; and a phase adjustment circuit that receives outputs of the first and second A/D converter circuits, and using the first clock signal as reference and using the second clock signal as a signal to be adjusted, adjusts a phase of the second clock signal based on the first clock signal.

The phase adjustment circuit includes: an interpolator that derives as an interpolation value a sampled value of an input signal at a sampling time corresponding to the second clock signal having a predetermined phase difference with respect to the first clock signal, using sets of sampling times of the first clock signal and sampled values of an input signal at the sampling times of the first clock signal based on an output sequence of the first A/D converter circuit; and a variable delay circuit that variably controls a delay of the second clock signal, based on an output of the second A/D converter circuit and the interpolation value.

In the present invention, the phase adjustment circuit includes:

a phase comparison circuit that receives the outputs of the first and second A/D converter circuits and an output of the interpolation value from the interpolator, generates and outputs a signal indicating a phase advance or a phase delay of the second clock signal responsive to a gradient of the input signal, based on the outputs of the first and second A/D converter circuits, and also outputs a signal indicating whether the output of the second A/D converter circuit matches the interpolation value or not;

a control circuit that causing a current state to be maintained when the output of the second A/D converter circuit matches the interpolation value, and outputs a signal indicating a polarity of a signal obtained by averaging signals from the phase comparison circuit each indicating the phase advance or the phase delay when the output of the second A/D converter circuit does not match the interpolation value; and the variable delay circuit that causes the delay of the second clock signal to be maintained without alteration or variably controls a length of the delay, based on an output of the control circuit.

A time-interleaved A/D converter device according to other aspect of the present invention includes:

first through Mth A/D converter circuits arranged in parallel with one another, the first through Mth A/D converter circuits receiving first through Mth clock signals, respectively (wherein M is a predetermined positive integer of a power of two); and first through (M−1)th phase adjustment circuits that receive outputs of the first through Mth A/D converter circuits, respectively, and using the first clock signal as reference and using the second through Mth clock signals as signals to be adjusted, adjust phases of the second through Mth clock signals, respectively, based on the first clock signal.

The ith phase adjustment circuit (wherein i is one of integers from one to M−1) includes:

an interpolator that derives as an interpolation value a sampled value at a sampling time corresponding to the ith clock signal having a predetermined phase difference with respect to the first clock signal, based on an output sequence of the first A/D converter circuit and using sets of sampling times of the first clock signal and sampled values of an input signal at the sampling times; and a variable delay circuit that variably controls a delay of the ith clock signal based on an output of the ith A/D converter circuit and the interpolation value.

In the present invention, the ith phase adjustment circuit (wherein i is the one of integers from one to M−1) includes:

a phase comparison circuit that receives an output of the first A/D converter circuit, the output of the ith A/D converter circuit, and an output of the interpolation value from the interpolator, generates and outputs a signal indicating a phase advance or a phase delay of the ith clock signal responsive to a gradient of the input signal, based on the outputs of the first and ith A/D converter circuits, and also outputs a signal indicating whether the output of the ith A/D converter circuit matches the interpolation value or not;

a control circuit that causes a current state to be maintained when the output of the ith A/D converter circuit matches the interpolation value, and outputs a signal indicating a polarity of a signal obtained by averaging signals from the phase comparison circuit each indicating the phase advance or the phase delay when the output of the ith A/D converter circuit does not match the interpolation value; and the variable delay circuit that causes the delay of the ith clock signal to be maintained without alteration or variably controls a length of the delay, based on an output of the control circuit.

In the present invention, the phase adjustment circuit includes:

first and second digital filters that receive an output of the first A/D converter circuit and the output of the second A/D converter circuit, respectively;

an interpolator which receives an output signal of the first digital filter, derives as an interpolation value a sampled value at a sampling time corresponding to the second clock signal using sets of sampling times of the first clock signal and sampled values of the input signal at the sampling times, and outputs an interpolation signal;

a phase comparison circuit that receives the output signal of the first digital filter, an output signal of the second digital filter, and the interpolation signal output from the interpolator, and outputs a first signal indicating a phase advance or a phase delay of the second clock signal responsive to a gradient of the input signal and a second signal indicating whether the output signal of the second digital filter matches the interpolation signal or not, the gradient of the input signal being derived from the output signals of the first and second digital filters, the phase delay or the phase advance being obtained from the output signal of the second digital filter and the interpolation signal;

a delay control signal generation circuit that receives the first and second signals output from the phase comparison circuit, outputs zero when the second signal indicates a match, and outputs a polarity of a value obtained by selecting a positive value or a negative value according to the delay or the advance indicated by the first signal and averaging selected values when the second signal indicates a mismatch; and a variable delay circuit that receives an output of the delay control signal generation circuit and variably controls a length of the delay.

In the present invention, the delay control signal generation circuit includes:

a selector that selects the positive value or the negative value according to the first signal;

a filter that averages outputs of the selector;

a circuit that extracts a sign of an output of the filter; and a second selector that performs selection between the sign of the output of the filter and zero according to a value of the second signal.

The meritorious effects of the present invention are summarized as follows.

According to the present invention, an input signal dedicated to clock skew adjustment and a switching circuit for the input signal become unnecessary.

According to the present invention, control is always performed over an A/D converted input. Thus, a change in the clock skew caused by temperature, voltage, or aged deterioration can be adjusted.

According to the present invention, automatic adjustment of a timing of the clock signal for the time-interleaved A/D converter device, in which the number of the A/D converter circuits is increased to M and the sampling frequency thereof is M times the sampling frequency of each of the A/D converter circuits, can be made.

According to the present invention, application to A/D converter circuits integrated on a semiconductor substrate is facilitated.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 6A and 6B are timing waveform diagrams explaining operations of a variable delay circuit in the first example of the present invention, respectively;

EXAMPLES OF THE INVENTION

Figure 1:
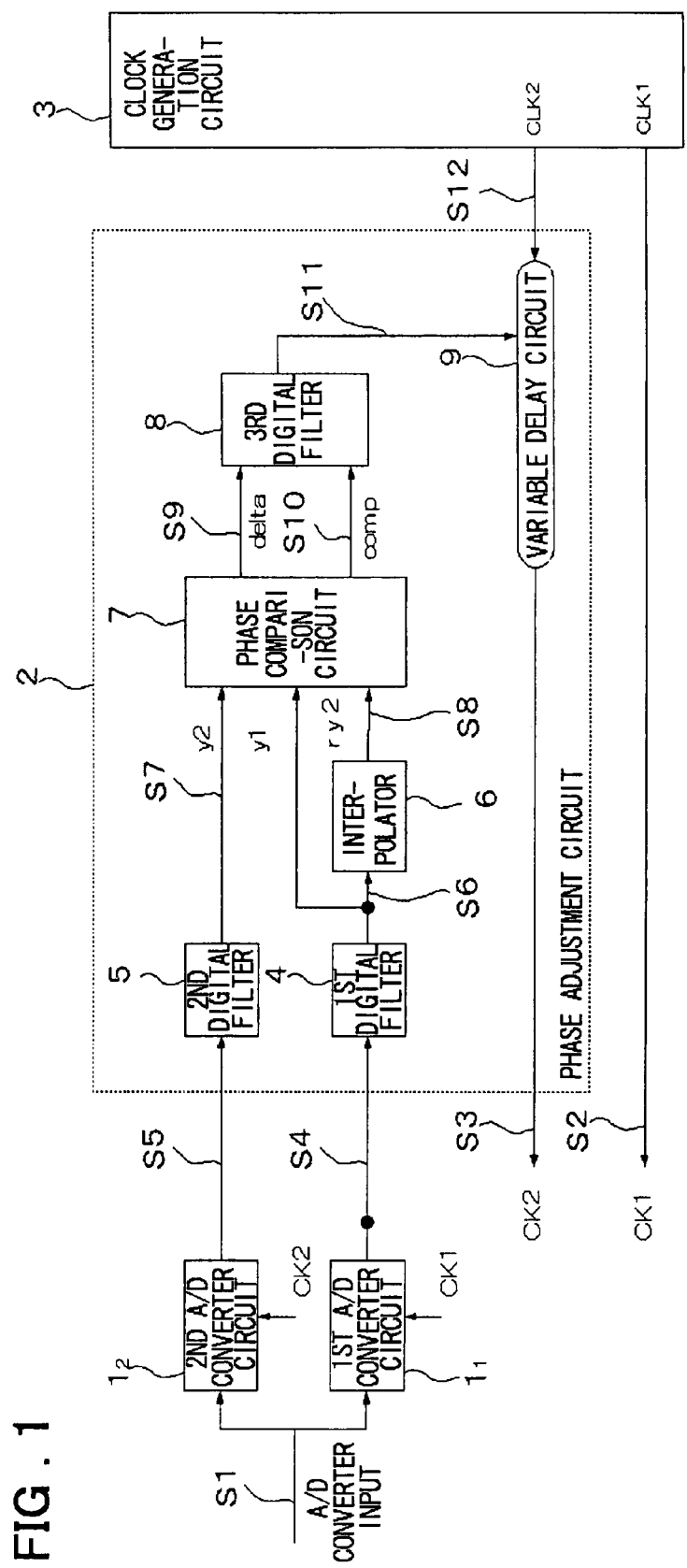
FIG. 1 is a diagram showing a configuration of a first example of the present invention.

In the present invention, one of first and second A/D converter circuits forming a time-interleaved A/D converter device is used as reference, while the other of the first and second A/D converter circuits is used as the A/D converter circuit under adjustment (calibration). Using an output sequence (of a plurality of sampled values) of a digital filter that receives a converted output (a digital signal) of the A/D converter circuit on a reference side, an interpolator performs interpolation processing, thereby obtaining an interpolation value (approximate converted result) at a timing free of a clock skew on the side under adjustment. Then, the interpolation value is compared with an A/D converted result of the A/D converter circuit under adjustment, and the clock skew of a clock under adjustment is adjusted.

The present invention includes at least first and second A/D converter circuits ($1_1$, $1_2$), and a phase adjustment circuit (2), corresponding to the first and second A/D converter circuits ($1_1$, $1_2$). The first and second A/D converter circuits ($1_1$, $1_2$) are arranged in parallel with each other and receive first and second clock signals (CK1, CK2) having a predetermined phase relationship, respectively. In the phase adjustment circuit (2), based on an output sequence of the first A/D converter circuit ($I_2$) on a reference side, an interpolation value corresponding to a case where the input signal is sampled using the ideal second clock signal free of a clock skew and having the predetermined phase relationship with respect to the first clock signal (CK1) is obtained. Then, based on an actual output (y2) of the second A/D converter circuit ($I_2$) under adjustment and an interpolation value (ry2), the phase adjustment circuit (2) controls a phase of the second clock signal (CK2) so that the actual output of the second A/D converter circuit ($I_2$) becomes close to or matches the interpolation value.

In the present invention, the phase adjustment circuit (2) includes first and second digital filters (4, 5), an interpolator (6), a phase comparison circuit (7), a digital filter (8), and a variable delay circuit (9). The first and second digital filters (4, 5) respectively perform filter processing on output signals of the first and second A/D converter circuits ($1_1$, $1_2$) driven by the first and second clocks (CK1, CK2), respectively. The interpolator (6) receives an output signal of the first digital filter (4) and determines the interpolation value corresponding to the case where the input signal is sampled using the second clock signal free of the clock skew and having the predetermined phase relationship with respect to the first clock signal. The phase comparison circuit (7) receives an output (y1) of the first digital filter (4) and the output (y2) of the second digital filter (5) and the interpolation signal (ry2) from the interpolator (6), and outputs a first signal (delta) indicating a phase delay or a phase advance of the second clock signal (CK2) responsive to a gradient of the input signal and a second signal (comp) indicating whether the output signal of the second digital filter matches the interpolation signal (ry2) or not. The digital filter (8) receives the first and second signals (delta, comp) output from the phase comparison circuit (7). When the second signal (comp) indicates a match, the digital filter (8) outputs zero. When the second signal (comp) indicates a mismatch, the digital filter (8) outputs a polarity of an averaged value obtained by selecting a positive value or a negative value according to the delay or the advance indicated by the first signal (delta) and averaging selected values. The digital filter (8) functions as a delay signal generation circuit for the variable delay circuit (9). The variable delay circuit (9) receives an output of the digital filter (8), and supplies to the second A/D converter circuit ($I_2$) the second clock signal (CK2) with a delay time thereof changed and a phase thereof adjusted.

An A/D converter circuit can perform A/D conversion of an input signal having a frequency of fs/2 (Nyquist Frequency) or less, where fs is a sampling frequency of the A/D converter circuits. When a component of a frequency higher than fs/2 is included in the input signal, the frequency component is folded over to fs/2 or less. When the input signal is the one for data processing, which is not a direct current signal, the input signal includes a signal of a low frequency of fs/2 or less.

A signal component of a low frequency of fs/2 or less is extracted from an input signal by a digital filter, and used as a clock skew adjusting signal.

In the present invention, the signal (clock skew adjusting signal) extracted by the digital filter on the reference side is subject to the interpolation processing by the interpolator, thereby calculating the interpolation value for the clock signal for the A/D converter circuit under adjustment.

In the present invention, a phase advance or a phase delay of the clock for the A/D converter circuit under adjustment is detected using a difference between the interpolation value derived by the interpolator and an actual result of conversion by the A/D converter circuit under adjustment. Control information on a variable delay adjustment circuit for adjusting a clock skew under adjustment is thereby obtained.

As described above, according to the present invention, a special analog circuit for clock skew adjustment is made unnecessary, and addition of an input signal for the clock skew adjustment or an input switch (S/W) becomes unnecessary.

FIG. 1 is a diagram showing a configuration of an example of the present invention. A time-interleaved A/D converter device using two A/D converter circuits is shown as an example, in FIG. 1. Referring to FIG. 1, this A/D converter device includes the first and second A/D converter circuits $1_1$ and $1_2$, the phase adjustment circuit 2, and a clock generation circuit 3 that outputs the two-phase clocks CLK1 and CLK2. Analog input terminals of the first and second A/D converter devices $1_1$ and $1_2$ are connected in common to an input, and the two-phase clocks CLK1 and CLK2 are used for the A/D converter devices $1_1$ and $1_2$, respectively, as sampling clocks, thereby forming the time-interleaved A/D converter device.

The phase adjustment circuit 2 includes the first and second digital filters 4 and 5, the interpolator 6 that receives the output of the first digital filter 4, the phase comparison circuit 7 that receives the output y1 of the first digital filter 4, the output y2 of the second digital filter 5, and the output ry2 of the interpolator 6, the third digital filter 8 that receives the outputs delta and comp of the phase comparison circuit 7, and the variable delay circuit 9 that receives the output of the third digital filter 8 as a control signal, variably delays the clock signal CLK2 output from the clock generation circuit 3 according to the control signal, and outputs the delayed clock signal CLK2.

In the example shown in FIG. 1, the first A/D converter circuit $1_1$ is used as a reference A/D converter circuit. The second A/D converter circuit $1_2$ is used as an A/D converter circuit under adjustment.

A phase relationship between the clock signal CK1 and the clock signal CK2 to be applied to the first A/D converter circuit $1_1$ and the second A/D converter circuit $1_2$, respectively, is set to a phase difference of 180 degrees.

The clock signal CLK2 output from the clock generation circuit 3 is input to the variable delay circuit 9. The clock signal CLK2 with the delay time thereof adjusted and output from the variable delay circuit 9 is supplied to the second A/D converter circuit $1_2$ as a conversion clock.

The clock signal CLK1 output from the clock generation circuit 3 is supplied to the first A/D converter circuit $1_1$ as a conversion clock.

An output S4 of the first A/D converter circuit $1_1$ and an output S5 of the second A/D converter circuit $1_2$ are supplied to the first digital filter 4 and the second digital filter 5 in the phase adjustment circuit 2, respectively.

Figure 2:
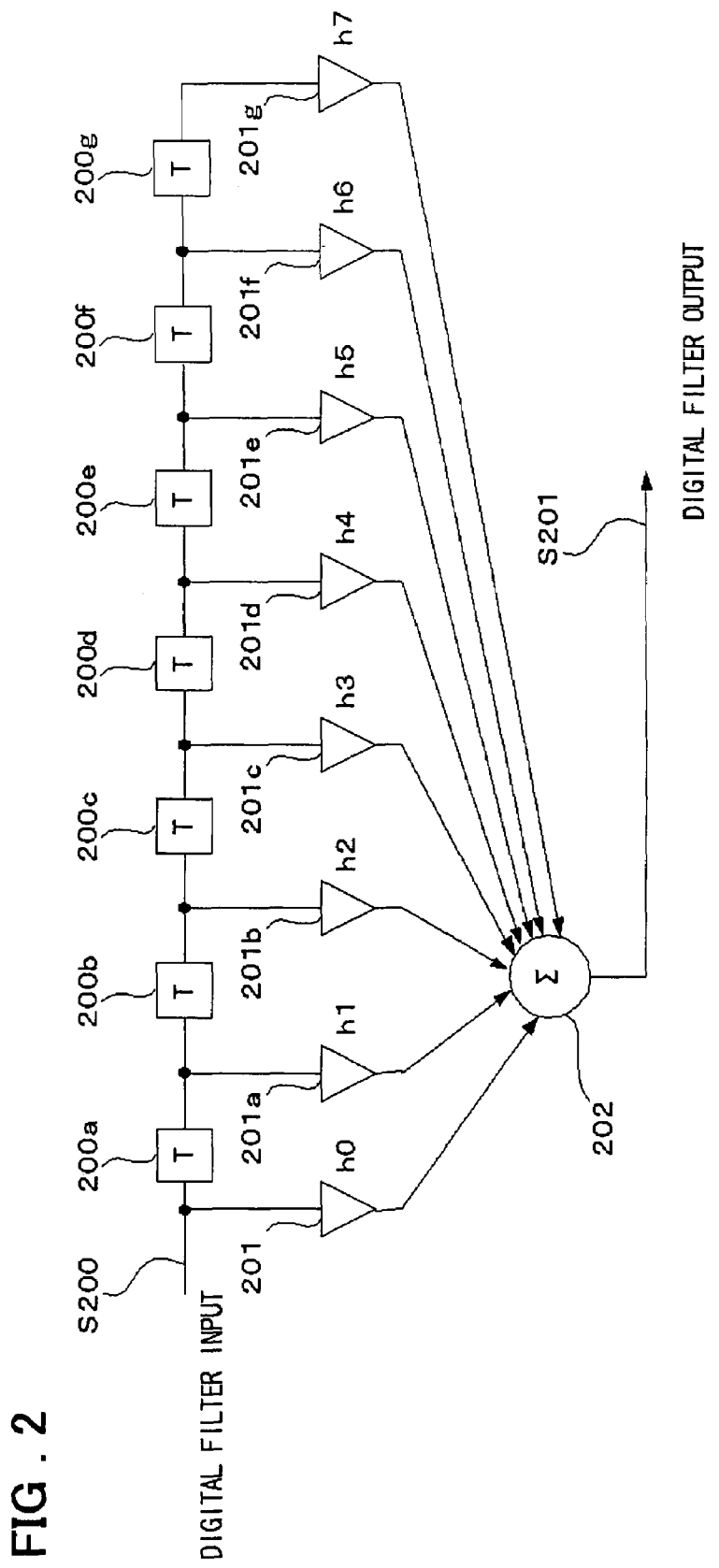
FIG. 2 is a diagram showing a configuration of a first digital filter, a second digital filter, or an interpolator in the first example of the present invention.

FIG. 2 is a diagram showing a configuration of each of the first digital filter 4, second digital filter 5, and interpolator 6.

FIG. 2 shows a configuration of an 8-tap FIR (finite impulse response) filter. The filter is not limited to such a configuration.

Referring to FIG. 2, reference numerals 200a to 200g denote delay circuits, reference numerals 201a to 201g denote filter coefficients, and reference numeral 202 denotes an adder circuit. When a digital filter input S200 is indicated by d(i) (in which i=0, 1, 2, . . . ), an output of the adder circuit is given by $\Sigma^7_{i=0} h_i d(7-i)$.

The first digital filter 4 and the second digital filter 5 extract a low-frequency component included in a signal input to the first A/D converter circuit $1_1$ and the second A/D converter circuit $1_2$, respectively, and outputs the digital signals y1 and y2, respectively.

Using data on the signal y1 (the output of the first digital filter 4 that receives a converted output of the first A/D converter circuit $1_1$) used as reference, the interpolator 6 determines the interpolation value (ry2) for the signal y2.

To the phase comparison circuit 7 in FIG. 1, the output y1 of the first digital filter 4, the output y2 of the second digital filter 5, and the output ry2 of the interpolator 6 are input.

Figure 5A:
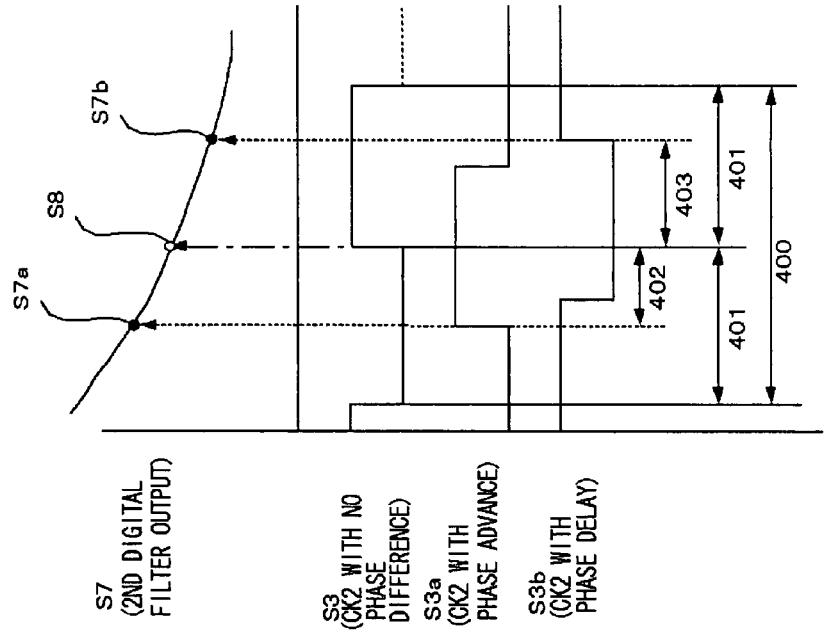
FIGS. 5A and 5B are diagrams showing a correspondence relationship between an output of the interpolator and an output of the second digital filter in the phase comparison circuit, respectively.
Figure 5B:
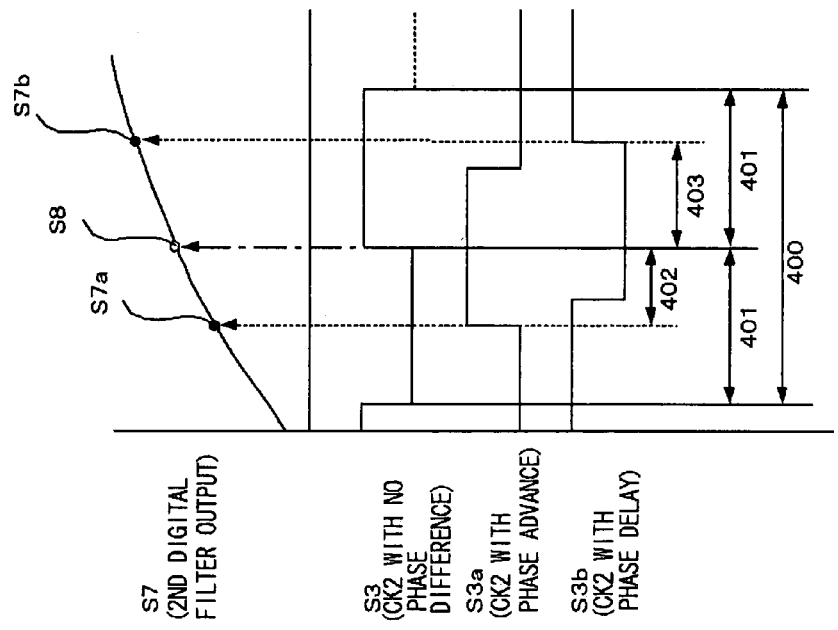

FIGS. 5A and 5B show a value of an output S8(ry2) of the interpolator 6 and a value of an output S7(y2) of the second digital filter 5 in the phase comparison circuit 7. FIGS. 5A and 5B show cases where the gradient of the input signal is positive (with the output S7 being larger when a phase of the clock signal CK2 is delayed than when the phase of the clock signal CK2 advances), and the gradient of the input signal is negative (with the output S7 being smaller when the phase of the clock signal CK2 is delayed than when the phase of the clock signal CK2 advances), respectively.

Referring to FIGS. 5A and 5B, an output S3 is the one when the clock signal CK2 for the second A/D converter circuit $1_2$ under adjustment has no phase difference deviation (from a phase of the clock signal CK1 on the reference side). The output S8 indicates the interpolation value determined by the interpolator 6, for the output S7 of the second digital filter 5 in FIG. 1 at a timing when the clock signal CK2 has no phase difference deviation.

Referring to FIGS. 5A and 5B, an output S3a is the one when the phase of the clock CK2 for the second A/D converter circuit $1_2$ under adjustment advances, and an output S3b is the one when the phase of the clock CK2 for the second A/D converter circuit $1_2$ under adjustment is delayed. The outputs of the second digital filter 5 in FIG. 1 for the clocks 2 in the respective cases are outputs S7a and S7b, respectively. Referring to FIGS. 5(A) and 5(B), while the clock CK2 for the output S3 has no phase difference, the phase of the clock CK2 for the output S3a advances, as indicated by reference numeral 402. A sampling value of an input signal to the second A/D converter circuit $1_2$ using this clock CK2 becomes the output S7a of the output S7. While the clock CK2 for the output S3 has no phase difference, the phase of the clock CK2 for the output S3b is delayed, as indicated by reference numeral 403. A sampling value of the input signal to the second A/D converter circuit $1_2$ using this clock CK2 becomes the output S7b of the output S7. Referring to FIGS. 5A and 5B, reference numeral 400 indicates one clock period, and reference numeral 401 indicates a half period (with a duty ratio of 50%).

As shown in FIGS. 5A and 5B, the phase of the clock CK2 can be determined by comparison between the values of the output S7 (S7a or S7b) and the output S8. However, according to the gradient of the input signal, a magnitude relation between the outputs S8 and S7 is inverted. In the case of FIG. 5A, the gradient of the output of the second digital filter (input signal) is positive. In this case, when the clock CK2 advances from the output S8, the output S7 (S7a) becomes smaller than the output S8. When the clock CK2 is delayed, the output S7 (S7b) becomes larger than the output S8. In the case of FIG. 5B, the gradient of the output of the second digital filter (input signal) is negative. When the clock CK2 advances from the output S8, the output S7 (S7a) is larger than the output S8. When the clock CK2 is delayed, the output S7 (S7b) becomes smaller than the output S8.

Figure 3:
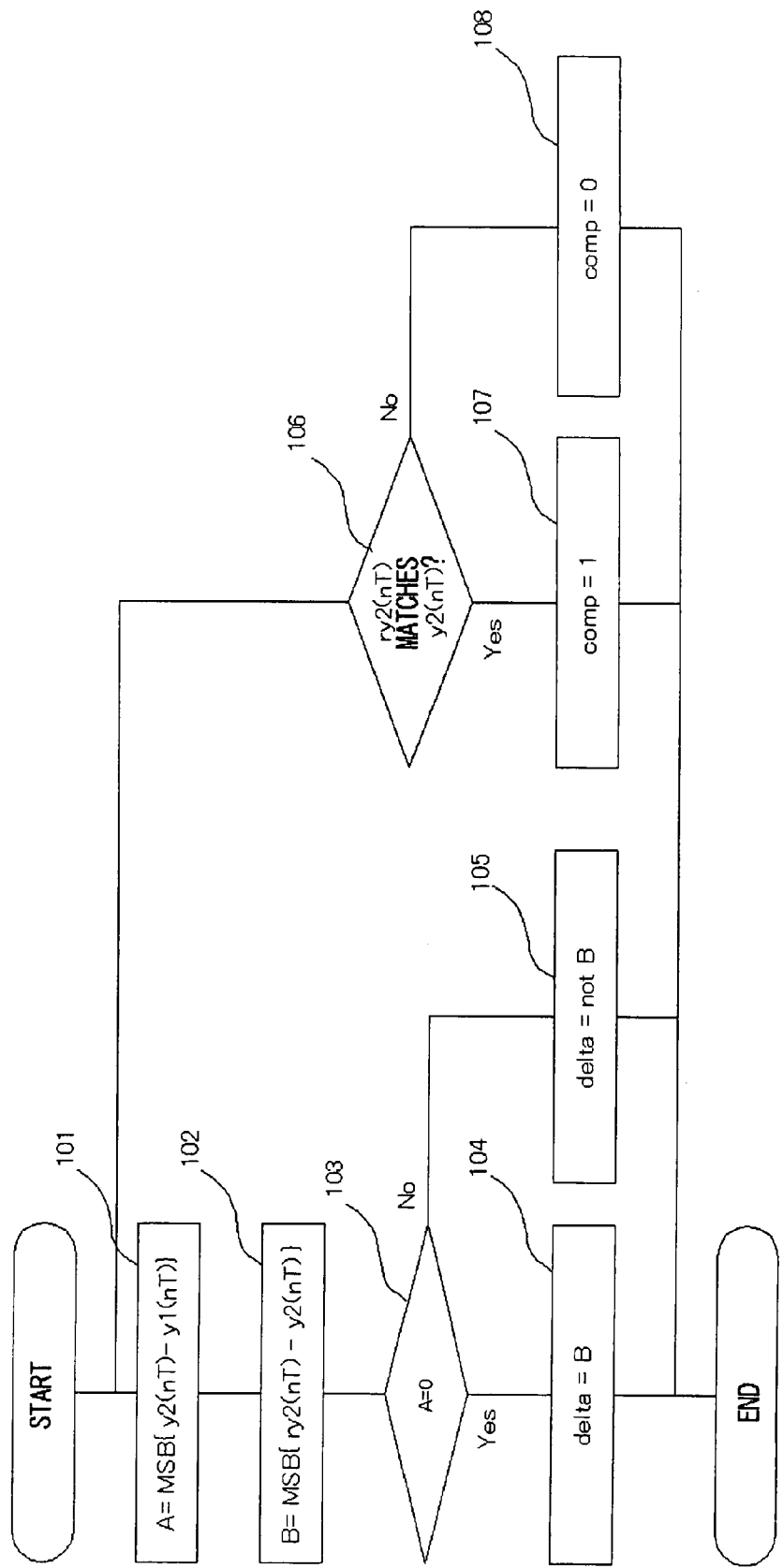
FIG. 3 is a flowchart explaining processing of a phase comparison circuit in the first example of the present invention.

FIG. 3 is a flowchart for explaining a processing operation of the phase comparison circuit 7 in FIG. 1. Outputs y1(nT), y2(nT), and ry2(nT) mean that the outputs are n-th sampled data of respective data when the period of the clocks CK1 and CK2 is indicated by T.

In processing at step 101, a gradient A of the signal as a result of extraction using the first and second digital filter 4 and 5 in FIG. 1 is obtained:

$$A=MSB[y2(nT)-y1(nT)]$$

The gradient A of the signal is an MSB value of a result of subtraction of the output y1(nT) from the output y2(nT). When the gradient of the signal indicates an increase, the MSB value becomes zero. When the gradient of the signal indicates a decrease, the MSB value becomes one.

In processing at step 102, an MSB value B of a result of subtraction of the output y2(nT) of the second digital filter 5 from the output ry2(nT) of the interpolator 6 is obtained:

$$B=MSB[ry2(nT)-y2(nT)]$$

With respect to a relationship between a phase advance and a phase delay of the clock CK2, the magnitude relation between the values of the output ry2(nT) and the output y2(nT) is inverted according to the gradient of a component of the signal as a result of extraction by the first and second digital filters 4 and 5, as shown in FIGS. 5A and 5B. Thus, in processing at step 103, the gradient A of the signal is determined, thereby performing switching between subsequent steps 104 and 105. Then, the signal delta, which indicates information on a phase advance or a phase delay of the clock CK2 is output to the third digital filter 8 in FIG. 1.

When A=0, delta=B

When A=1, delta=not B

In processing at step 106 (which may be performed in parallel with step 101), it is determined whether the output ry2(nT) of the interpolator 6 matches the output y2(nT) of the second digital filter 5, and the signal comp, which indicates information showing whether the output ry2(nT) matches the output y2(nT) or not (or indicating a result of comparison) is output to the third digital filter 8.

The phase comparison circuit 7 in FIG. 1 receives the outputs y1 and y2 of the digital filters and the interpolation value ry2, and outputs the signal delta, which indicates the information on the phase advance or the phase delay of the clock CK2 and the signal comp indicating whether the output ry2(nT) matches the output y2(nT) or not.

Figure 4:
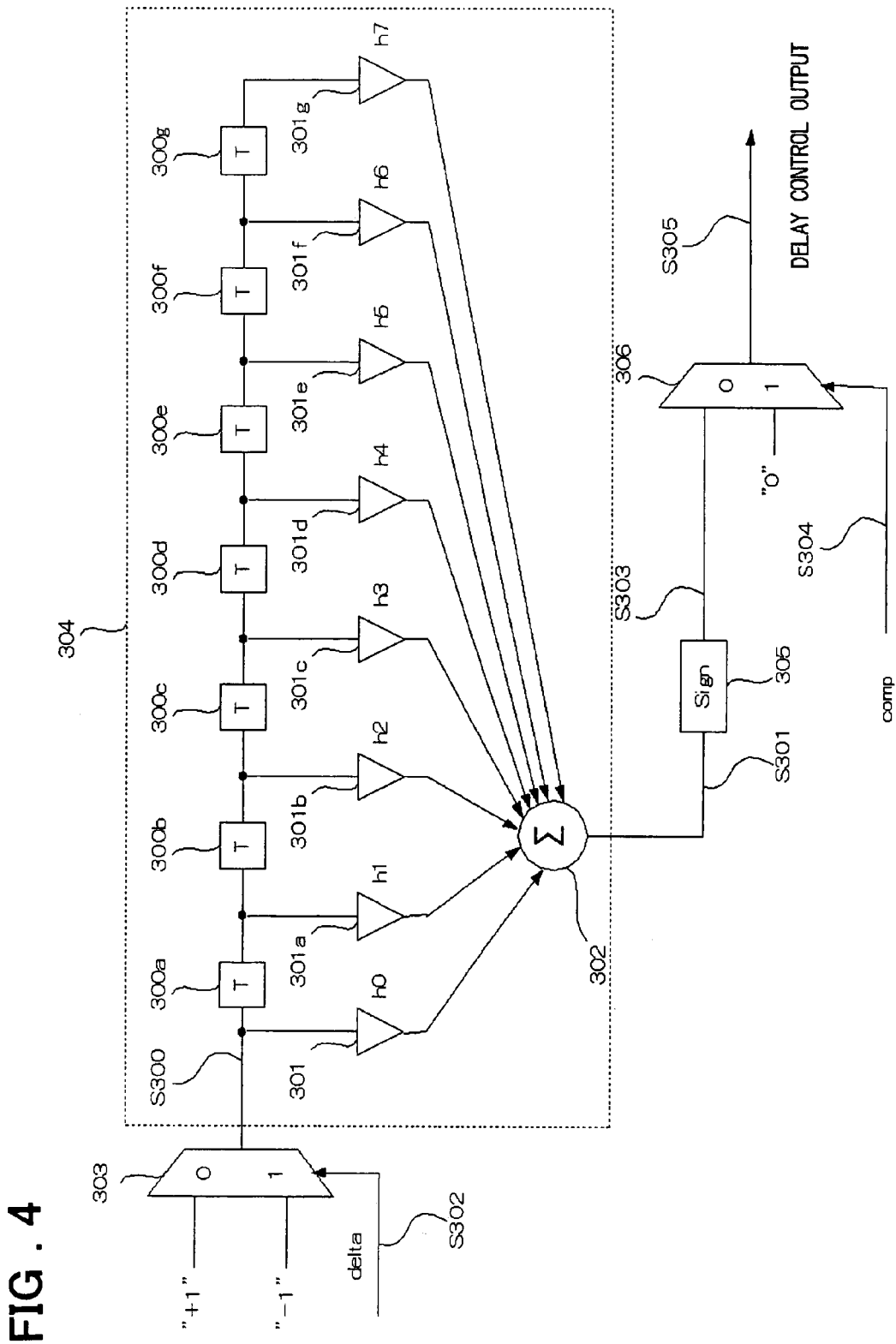
FIG. 4 is a diagram showing a configuration of a third digital filter in the first example of the present invention.

FIG. 4 is a diagram showing an example of a circuit configuration of the third digital filter 8 in FIG. 1. Referring to FIG. 4, the third digital filter 8 is implemented by the 8-tap FIR filter. The configuration of the filter is not, however, limited to this 8-tap FIR filter.

Referring to FIG. 4, reference numeral 304 indicates the 8-tap FIR filter. Reference numerals 300a to 300g indicate delay circuits that constitute the FIR filter indicated by reference numeral 304. Reference numerals 301a to 301g indicate coefficients of the FIR filter, respectively, and reference numeral 302 indicates an adder circuit. Reference numerals 303 and 306 indicate selectors, respectively, and reference numeral 305 indicates a Sign (sign) circuit that outputs a sign of an input signal. The Sign (sign) circuit 305 outputs +1 when an output S301 of the 8-tap FIR filter 304 (or, an output of the adder circuit 302) is positive (not negative), and outputs −1 when the output S301 is negative, for example.

The selector 303 receives +1 and −1, and receives the signal delta, which is an output S9 of the phase comparison circuit 7 in FIG. 1 as a selection control signal.

When the signal delta indicates one, the selector selects and outputs −1.

When the signal delta indicates zero, the selector selects and outputs +1.

The output of the selector 303 is input to the 8-tap FIR filter 304.

The FIR filter 304 averages results of phase comparison by the phase comparison circuit 7 in FIG. 1 and outputs a delay control signal S305.

The selector 306 receives the output of the Sign circuit 305 and zero, and receives the signal comp, which is an output S10 of the phase comparison circuit 7 in FIG. 1, as a selection control signal. When a comp value is one, the selector 306 selects and outputs a sign S303 of the output S301 of the FIR filter 304, extracted by the Sign circuit 305. When the comp value is zero, the selector 306 selects and outputs zero.

The output of the selector 306 is input to the variable delay circuit 9 in FIG. 1 as the control signal for changing a delay time.

FIGS. 6A and 6B are timing diagrams for explaining operations of the variable delay circuit 9 in FIG. 1, respectively. Referring to FIGS. 6A and 6B, reference numeral 400 indicates one clock period as in FIGS. 5A and 5B.

When the phase of the clock CLK2 is delayed (or when the clock CK2 is delayed from the clock CK1 by an amount more than 180 degree, which is the original phase difference), an output S11 of the third digital filter 8 in FIG. 1 becomes +1.

When the phase of the clock CLK2 advances (or when the clock CK2 advances from the clock CK1 by an amount more than 180 degree, which is the original phase difference), the output 511 of the third digital filter 8 in FIG. 1 becomes −1. When the phase of the clock CLK2 matches the phase of the clock CK1, the output 511 becomes zero.

The variable delay circuit 9 performs processing of:

not changing a delay when a value of the output S11 of the third digital filter 8 is zero;

advancing the clock CK2 by one step (which is a unit of one delay) (refer to FIG. 6A) when the value of the output S11 is +1; or delaying the clock CLK2 by one step (refer to FIG. 6B) when the value of the output S11 is −1, thereby changing the delay (phase) of the clock CLK2, for supply to the second A/D converter circuit $1_2$ as the clock CK2.

A series of processing described above is repeated, and delay control is performed so that the skew of the clock CK2 of the second A/D converter circuit $1_2$ is finally eliminated.

Operations in this example are summarized as follows:

The low-frequency component included in the input signal is sampled by the first and second A/D converter circuits $1_1$ and $1_2$, and extracted by the first and second digital filters 4 and 5, respectively.

Using a data series (a digital data series obtained by sampling the input signal) extracted by the first A/D converter circuit $1_1$ on the reference side, the interpolation value under adjustment is calculated by the interpolator 6, as follows. Interpolation calculation using the digital filter in FIG. 2 as the interpolator 6 will be described below.

When (N+1) points (x(0), y(0)), (x(1), y(1)), (x(2), y(2)), (x(N), y(N)) are known, a polynomial y for x which passes through all of these points is expressed as follows by the Lagrange interpolation method, for example (refer to Non-patent Document 1):

$$y = \sum_{k=0}^{N} y(k) \cdot h(k) \quad (1)$$

$$h(k) = \prod_{i \neq k}^{N} \frac{(x - x(i))}{(x(k) - x(i))}$$

where x(k) indicates a sampling time using the clock CK1 for the first A/D converter circuit $1_1$.

When the period of the clock CK1 is indicated by T, the nth sampling time using the clock CK1 can be expressed as x(nT)=nT, and an output S6 of the first digital filter 4 can be expressed as y(nT).

Further, when substitution of K=(n−(N−1)/2)+kT and i=(n−(N−1)/2)T+iT in the above expression (1) is performed, an approximate value of a result of sampling at a sampling time x using results of sampling at (N+1) points can be expressed by Expression (2)

$$y = \sum_{k=0}^{N} y\left(\left(n - \frac{N-1}{2} + k\right)T\right) \cdot h\left(\left(n - \frac{N-1}{2} + k\right)T\right) \quad (2)$$

$$h\left(\left(n - \frac{N-1}{2} + k\right)T\right) = \prod_{i \neq k}^{N} \frac{x - \left(n - \frac{N-1}{2} + i\right)T}{(k-i)T}$$

When x is set to a sampling time for the clock CK2 free of the clock skew, which is delayed by T/2 (180 degrees) from the clock CK1, or when x=(n+1/2)T, y in Expression (2) becomes the interpolation value ry2(nT) to be obtained, shown in Expression (3).

$$ry2(nT) = \sum_{k=0}^{N} y\left(\left(n - \frac{N-1}{2} + k\right)T\right) \cdot h\left(\left(n - \frac{N-1}{2} + k\right)T\right) \quad (3)$$

$$h\left(\left(n - \frac{N-1}{2} + k\right)T\right) = \prod_{i \neq k}^{N} \frac{\left(\frac{N}{2} + i\right)}{(k-i)}$$

Expression (3) indicates a transfer function of an (N+1) tap FIR filter using $$h\left(\left(n - \frac{N-1}{2} + k\right)T\right)$$

as coefficient.

From Expression (3), it can be seen that $$h\left(\left(n - \frac{N-1}{2} + k\right)T\right)$$

is always constant regardless of n, and therefore becomes a constant (constant). That is, as the coefficient of the FIR filter, a constant value may be employed.

When N is set to 7 in Expression (3), an interpolator using eight data can be implemented by the digital filter shown in FIG. 2.

Using this interpolator, and using eight sampled data of the output S6 of the first digital filter 4, the interpolation value at the timing free of the skew can be determined for the clock CK2.

Using the interpolation value S8 thus obtained, the output S6 of the first digital filter 4, and the output S7 of the second digital filter 5, and based on a relationship between the values of the outputs S8 and S7 shown in FIG. 5, information on a clock advance or a clock delay of the clock CK2 can be obtained.

By averaging the information on the clock advance or the clock delay of the clock CK2 by the third digital filter 8, an influence by an error or a noise is suppressed, and the variable delay circuit 9 is controlled.

When the clock skew of the clock CK2 is eliminated, the interpolation value S8 matches the output S7 of the second digital filter 5.

For this reason, the output S10 (comp) of the phase comparison circuit 7 in FIG. 1 becomes one, and the control signal S11 for the variable delay circuit 9 becomes zero. That is, control over delay adjustment by the variable delay circuit 9 has been completed, and the clock CK2 has been adjusted to the one at the timing free of the clock skew.

According to the present invention, using data on a low-frequency component included in an input signal extracted by the digital filters from outputs of the two A/D converter circuits forming the time-interleaved A/D converter device, the interpolation value at the timing free of the clock skew under adjustment can be obtained using the interpolation processing.

By comparing the interpolation value with the value of the output of the digital filter under adjustment using the relationship shown in FIG. 5, information on a clock advance, a clock delay, or a match can be obtained.

Figure 10:
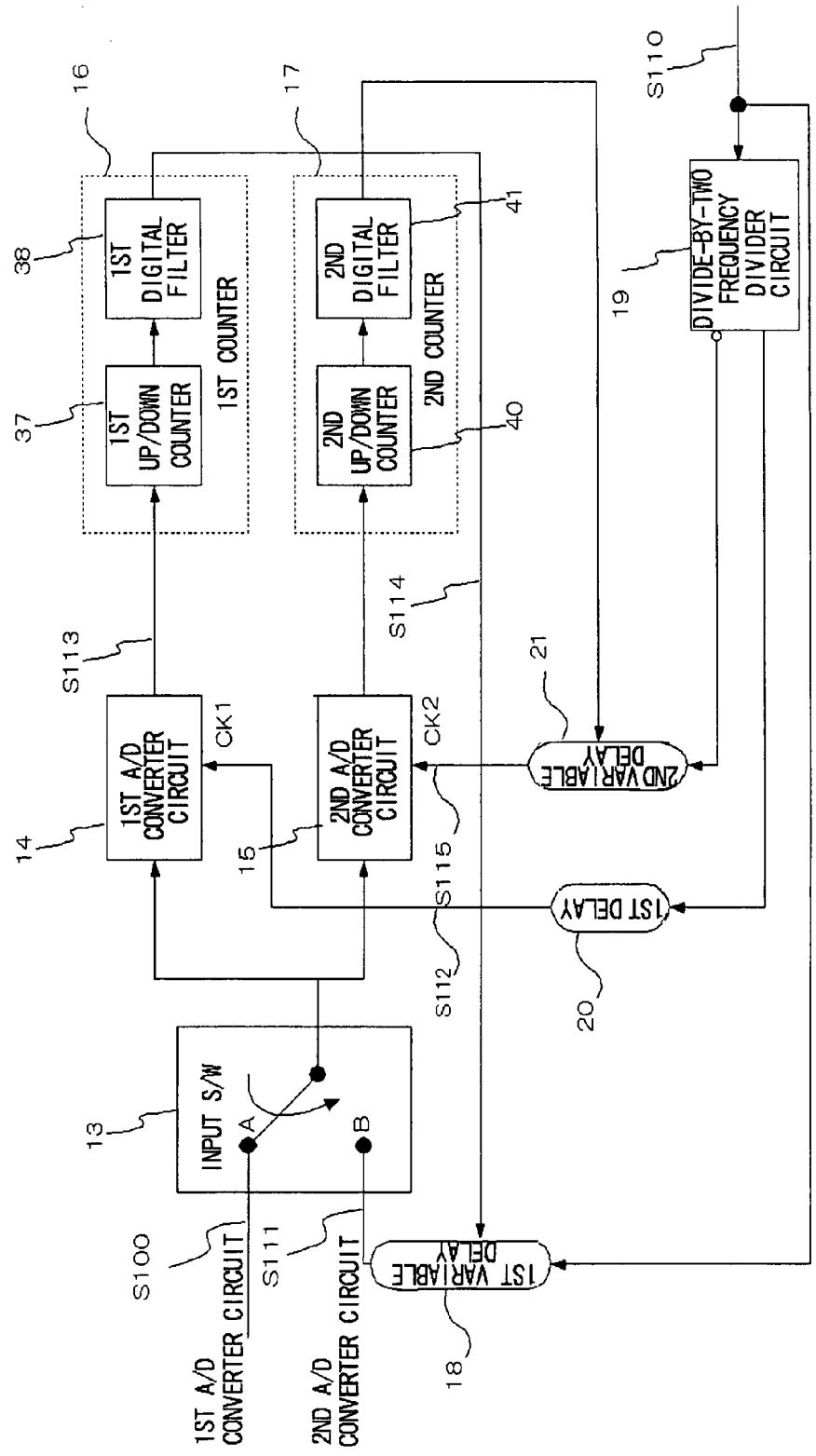
FIG. 10 is a diagram showing an example of a circuit configuration of Patent Document 1 (JP Patent Kokai Publication No. JP-A-11-195988)
Figure 11A:
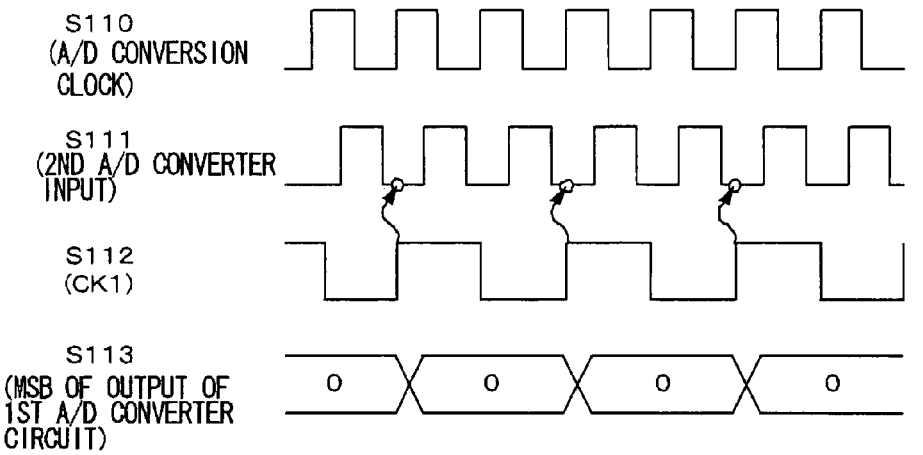
FIGS. 11A, 11B, and 11C are timing diagrams explaining operations of a circuit in FIG. 10, respectively.
Figure 11B:
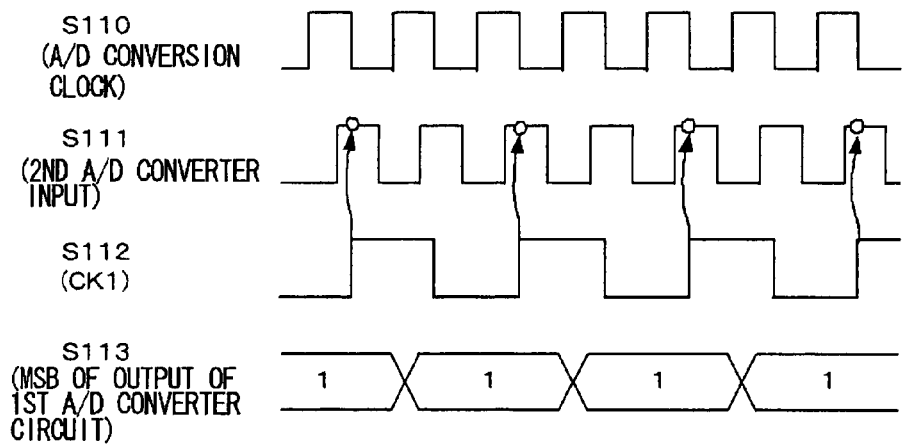
Figure 11C:
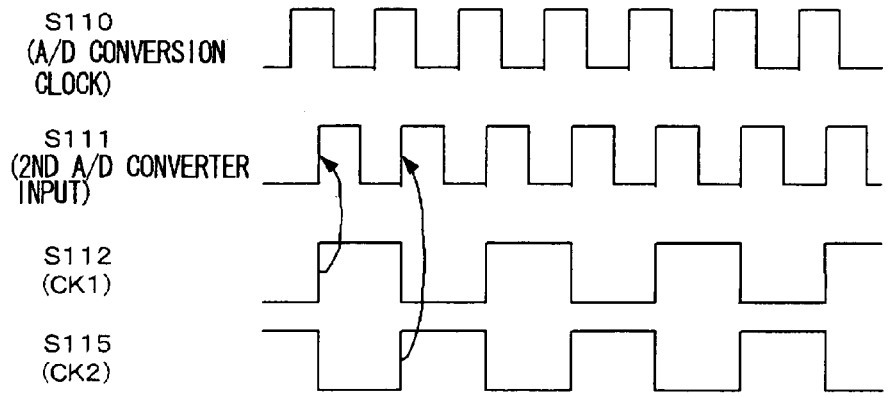

Hence, according to this example,
the need for provision of the switch S/W for inputs of the A/D conversion circuits so as to perform switching between clock skew adjustment and a usual operation as shown in FIG. 10 is eliminated; and
the clock skew adjustment can be made, without using the input signal dedicated to the clock skew adjustment.

Further, according to this example, switching between the clock skew adjustment and the usual operation is not necessary. Thus, a change in the clock skew can always be fed back.

The example in FIG. 1 shows the time-interleaved A/D converter device that uses the two A/D converter circuits $1_1$ and $1_2$, and a sampling frequency of the time-interleaved A/D converter device is set to be twice as large as that of each of the A/D converter circuit $1_1$ or $1_2$.

Figure 7:
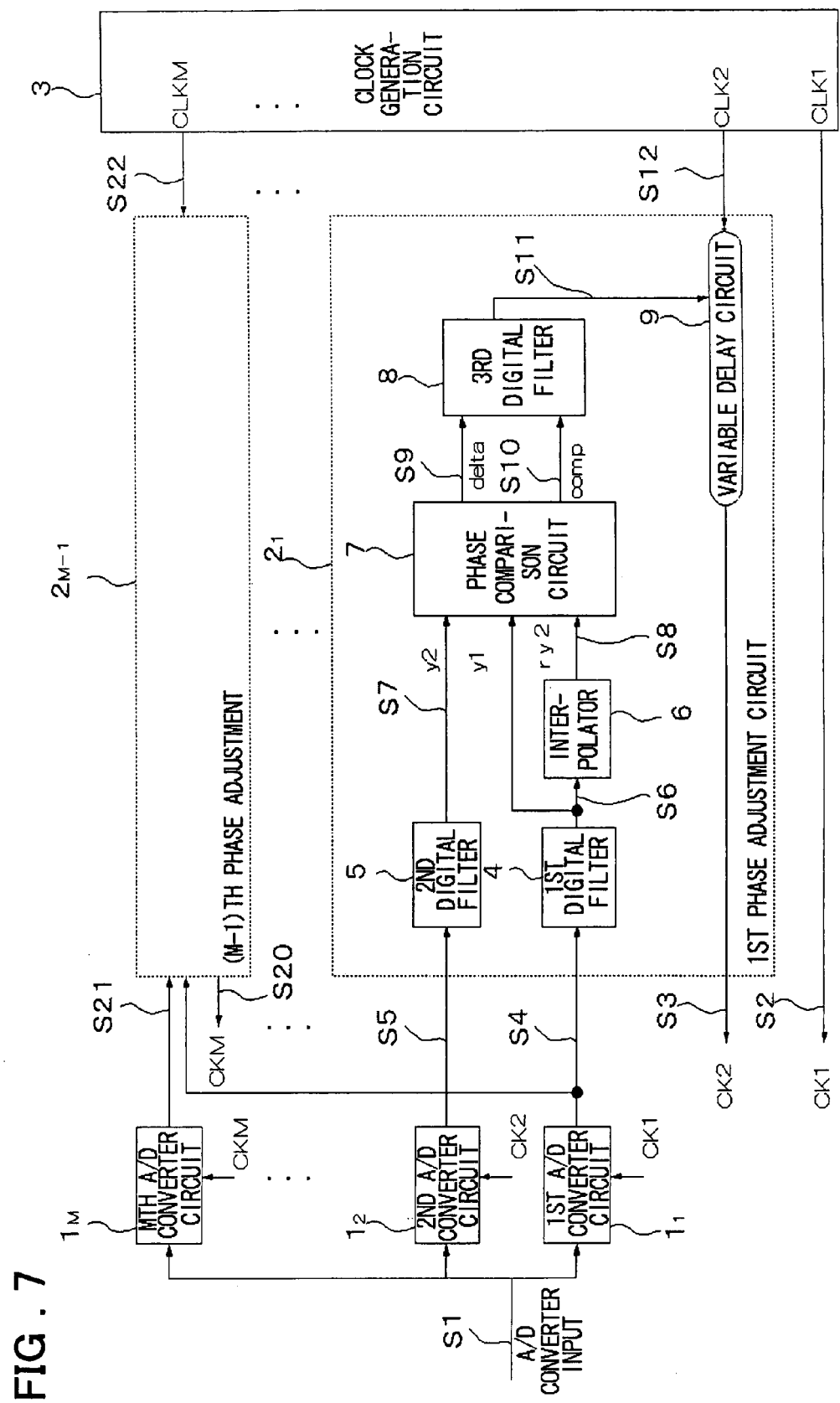
FIG. 7 is a diagram showing a configuration of a second example of the present invention.
Figure 8:
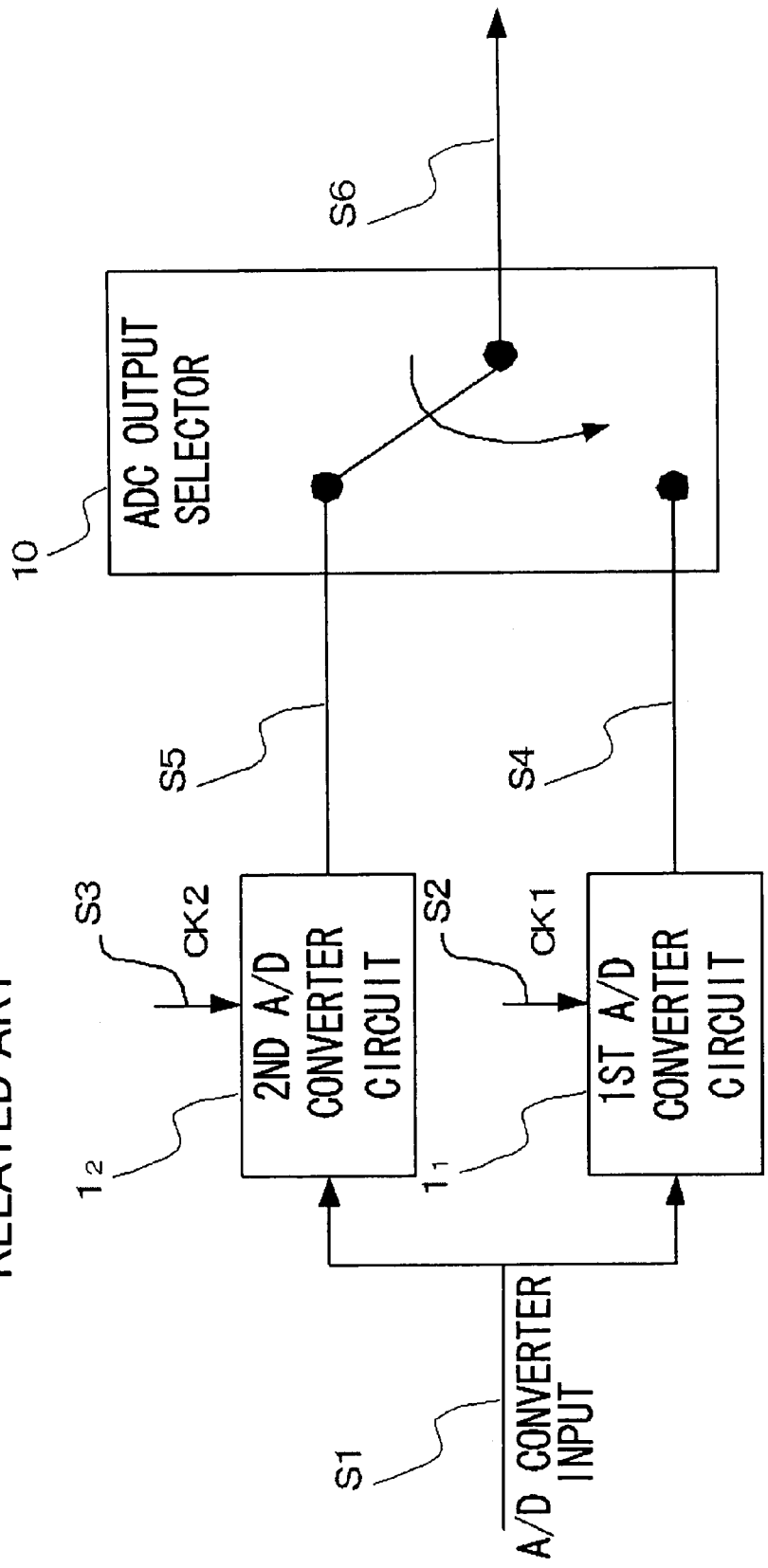
FIG. 8 is a diagram showing a configuration example of a conventional time-interleaved A/D converter device.
Figure 9:
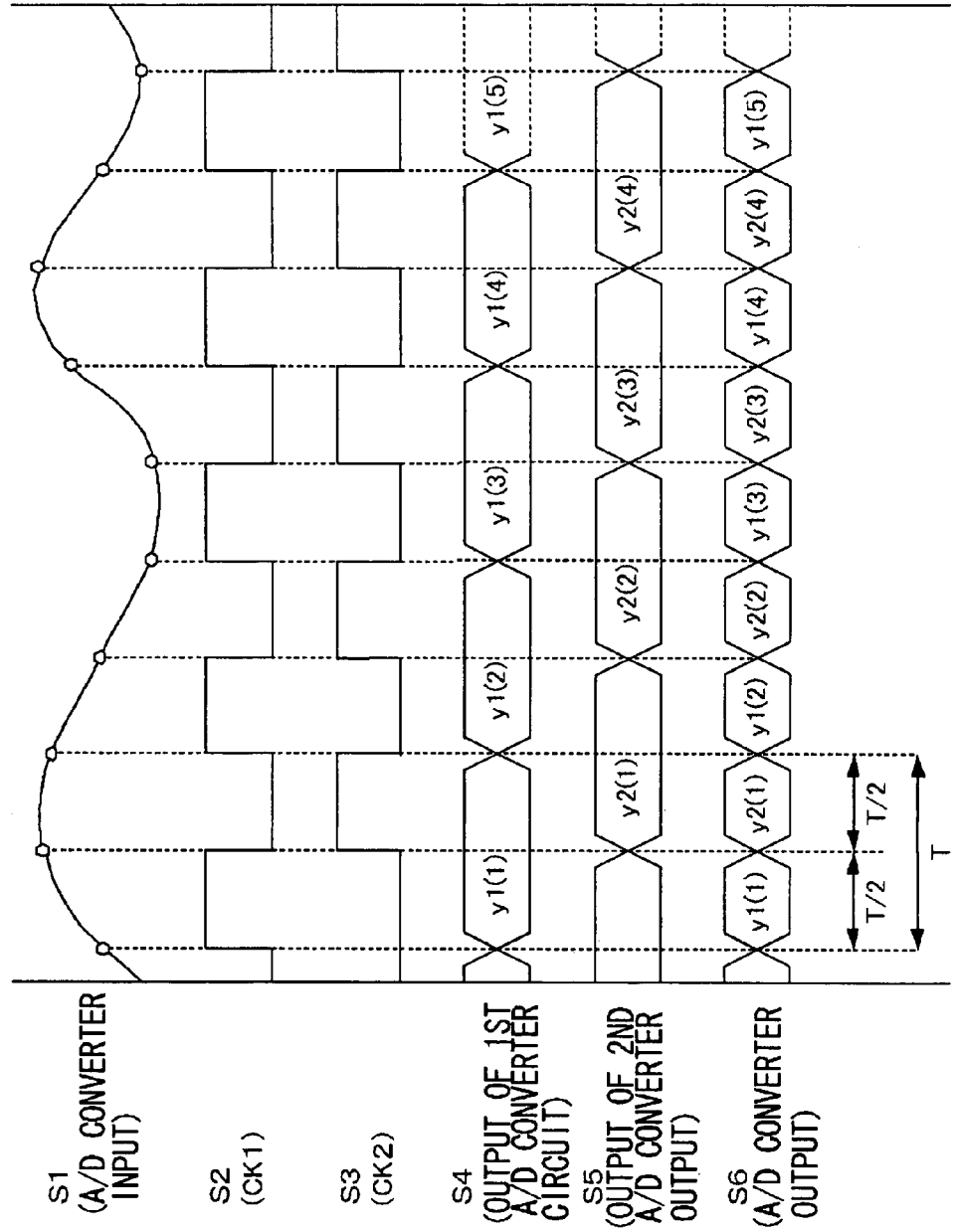
FIG. 9 is a timing diagram explaining an operation of the time-interleaved A/D converter device in FIG. 8.

In other example of the present invention, in order to further increase the sampling frequency, a configuration shown in FIG. 7, for example, is employed.

FIG. 7 is a diagram showing a configuration of a second example of the present invention. Phase adjustment circuits $2_1$ to $2_{M-1}$ in FIG. 7 are obtained by arrangement of (M−1) of the phase adjustment circuits 2 in FIG. 1 in parallel, and forms a time-interleaved A/D converter device that uses M A/D converter circuits formed of the A/D converter circuits $1_1$, $1_2$, and A/D converter circuits $1_3$ to $1_M$. That is, referring to FIG. 7, the time-interleaved A/D converter device includes the first through Mth A/D converter circuits $1_1$ to $1_M$, and the first through (M−1)th phase adjustment circuits $2_1$ to $2_{M-1}$. The A/D converter circuits $1_1$ to $1_M$ are arranged in parallel with one another and receive the first, the second, and third through Mth clock signals CK1 to CKM, respectively (in which M is a predetermined positive integer of a power of two). The first through (M−1)th phase adjustment circuits $2_1$ to $2_{M−1}$ receive outputs of the first through Mth A/D converter circuits $1_1$ to $1_M$, respectively, and using the first clock signal as reference and using the second through Mth clock signals as signals to be adjusted, adjust phases of the second through Mth clock signals, respectively, based on the first clock signal. The ith phase adjustment circuit $2_i$ (wherein i is one of integers from one to M−1) includes the interpolator 6, phase comparison circuit 7, digital filter 8, and variable delay circuit 9. Based on a sequence of outputs of the first A/D converter circuit $1_1$ (outputs of the digital filter 4) and using sets of sampling times of the first clock signal CK1 and sampled values of an input signal at the sampling times, the interpolator 6 derives as an interpolation value a sampled value at a sampling time corresponding to the ith clock signal Cki having a predetermined phase difference with respect to the first clock signal CK1. The phase comparison circuit 7 receives outputs of the digital filters 4 and 5 and an output of the interpolation value from the interpolator 6, and generates and outputs a signal indicating a delay or an advance of a phase of the ith clock signal CKi responsive to a gradient of the input signal, based on an output of the first A/D converter circuit and an output of the ith A/D converter circuit (an output of the digital filter 5). The phase comparison circuit 7 also outputs a signal indicating whether the output of the ith A/D converter circuit $1_1$ matches the interpolation value or not. The digital filter 8 forms a delay control signal generation circuit. The delay control signal generation circuit causes a current state to be maintained when the output of the ith A/D converter circuit matches the interpolation value. When the output of the second A/D converter circuit does not match the interpolation value, the delay control signal generation circuit outputs a signal that indicates a polarity of a signal obtained by averaging signals of the phase comparison circuit each indicating a phase advance or a phase delay. The variable delay circuit 9 maintains the delay of the ith clock signal as it is currently, or performs adjusting control over a length of delay.

Herein, n is set to an integer, while M is set to two to the power of n. In this circuit, the output of the A/D converter circuit 1 used as reference is input to the phase adjustment circuit for each A/D converter circuit. Then, the clock skew can be automatically adjusted so that the clock for each A/D converter circuit becomes the one at an appropriate timing with respect to the reference clock. By setting filter coefficients of the interpolator 6 in the phase adjustment circuit for each A/D converter circuit in accordance with each clock timing, the interpolation value can be determined. Accordingly, a special analog circuit and addition of an input signal for clock skew adjustment is not required.

When this example configured as described above is used, automatic adjustment of the skew of the clock signal for the time-interleaved A/D converter device with M times the sampling frequency of each A/D converter circuit can be made.

According to this example, the input signal dedicated to the clock skew adjustment and the switching circuit for the input signal dedicated to the clock skew adjustment become unnecessary.

According to this example, control is always performed over an A/D converted input. Thus, a change in the clock skew caused by temperature, voltage, or aged deterioration can be adjusted.

Further, according to this example, automatic adjustment of a timing of the clock signal for the time-interleaved A/D converter device, in which the number of the A/D converter circuits is increased to M and the sampling frequency thereof is M times the sampling frequency of each of the A/D converter circuits, can be made.

Then, this example facilitates application to A/D converter circuits integrated on a semiconductor substrate.

The above description was directed to the example described above. The present invention, however, is not limited to the configuration of the examples, and of course includes various variations and modifications that could be made by those skilled in the art. The disclosure of each of the above mentioned NON-PATENT DOCUMENT and PATENT DOCUMENT is herein incorporated in its entirety by reference.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the

What is claimed is:

1. A time-interleaved A/D converter device comprising:
   first and second A/D converter circuits arranged in parallel with each other, said first and second A/D converter circuits receiving first and second clock signals having a predetermined phase relationship therebetween, respectively, and operating a time-interleaved manner; and
   a phase adjustment circuit provided corresponding to said first and second A/D converter circuits;
   said phase adjustment circuit including an interpolator that derives an interpolation value corresponding to a case where an input signal is sampled using a second clock signal which is free of a clock skew and has the predetermined phase relationship with respect to the first clock signal, based on an output sequence of said first A/D converter circuit that samples the input signal using the first clock signal;
   said phase adjustment circuit controlling a phase of the second clock signal so that an actual output of said second A/D converter circuit becomes close to the interpolation value or matches the interpolation value, based on the actual output of said second A/D converter circuit and the interpolation value.

2. A time-interleaved A/D converter device comprising:
   first and second A/D converter circuits arranged in parallel with each other, said first and second A/D converter circuits receiving first and second clock signals having a predetermined phase relationship, therebetween, respectively; and
   a phase adjustment circuit that receives outputs of said first and second A/D converter circuits, and using the first and second clock signals as a reference signal and a signal to be adjusted, respectively, adjusts a phase of the second clock signal, based on the first clock signal;
   said phase adjustment circuit comprising:
   an interpolator that derives as an interpolation value a sampled value of an input signal at a sampling time corresponding to the second clock signal having a predetermined phase difference with respect to the first clock signal, using sets of sampling times of the first clock signal and sampled values of an input signal at the sampling times of the first clock signal, based on an output sequence of said first A/D converter circuit; and
   a variable delay circuit that variably controls a delay of the second clock signal, based on an output of said second A/D converter circuit and the interpolation value.

3. The time-interleaved A/D converter device according to claim 2, wherein said phase adjustment circuit comprises:
  a phase comparison circuit that receives the outputs of said first and second A/D converter circuits and an output of the interpolation value from said interpolator, generates and outputs a signal indicating a phase advance or a phase delay of the second clock signal responsive to a gradient of the input signal, based on the outputs of said first and second A/D converter circuits, and also supplies a signal indicating whether the output of said second A/D converter circuit matches the interpolation value or not;
  a delay control signal generation circuit that causes a current state to be maintained when the output of said second A/D converter circuit matches the interpolation value, and outputs a signal indicating a polarity of a signal obtained by averaging signals from said phase comparison circuit each indicating the phase advance or the phase delay when the output of the second A/D converter circuit does not match the interpolation value; and
  said variable delay circuit that causes the delay of the second clock signal to be maintained without alteration or variably controls a length of the delay, based on an output of said delay control signal generation circuit.

4. A time-interleaved A/D converter device comprising:
  first through Mth A/D converter circuits arranged in parallel with one another, said first through Mth A/D converter circuits receiving first through Mth clock signals, respectively (wherein M is a predetermined positive integer of a power of two); and
  first through (M-1)th phase adjustment circuits that receive outputs of said first through Mth A/D converter circuits, respectively, and using the first clock signal as a reference signal and using the second through Mth clock signals as signals to be adjusted, adjust phases of the second through Mth clock signals, respectively, based on the first clock signal;
  said ith phase adjustment circuit (wherein i is one of integers from one to M-1) comprising:
  an interpolator that derives as an interpolation value a sampled value at a sampling time corresponding to the ith clock signal having a predetermined phase difference with respect to the first clock signal, using sets of sampling times of the first clock signal and sampled values of an input signal by the first A/D converter circuit at the sampling times, based on an output sequence of the first A/D converter circuit; and
  a variable delay circuit that variably controls a delay of the ith clock signal based on an output of said ith A/D converter circuit and the interpolation value.

5. The time-interleaved A/D converter device according to claim 4, wherein said ith (wherein i is one of integers from one to M-1) phase adjustment circuit comprises:
  a phase comparison circuit that receives an output of said first A/D converter circuit, the output of said ith A/D converter circuit, and an output of the interpolation value from said interpolator, generates and outputs a signal indicating a phase advance or a phase delay of the ith clock signal responsive to a gradient of the input signal, based on the outputs of said first and ith A/D converter circuits, and also outputs a signal indicating whether the output of said ith A/D converter circuit matches the interpolation value or not;
  a control circuit that causes a current state to be maintained when the output of said ith A/D converter circuit matches the interpolation value, and outputs a signal indicating a polarity of a signal obtained by averaging signals from said phase comparison circuit each indicating the phase advance or the phase delay when the output of the ith A/D converter circuit does not match the interpolation value; and
  said variable delay circuit that causes the delay of the ith clock signal to be maintained without alteration or variably controls a length of the delay, based on an output of said control circuit.

6. The time-interleaved A/D converter device according to claim 1, wherein said phase adjustment circuit comprises:
  first and second digital filters that receive an output of said first A/D converter circuit and the output of said second A/D converter circuit, respectively;
  said interpolator receiving an output signal of said first digital filter, deriving as said interpolation value a sampled value of an input signal at a sampling time corresponding to the ideal second clock signal, using sets of sampling times of the first clock signal and sampled values of the input signal at the sampling times of the first clock signal, and outputting an interpolation signal;
  said phase adjustment circuit further comprising:
  a phase comparison circuit that receives the output signal of said first digital filter, an output signal of said second digital filter, and the interpolation signal output from said interpolator, and outputs a first signal indicating a phase advance or a phase delay of the second clock signal responsive to a gradient of the input signal and a second signal indicating whether the output signal of said second digital filter matches the interpolation signal or not, the gradient of the input signal being derived from the output signals of said first and second digital filters, the phase delay or the phase advance being obtained from the output signal of said second digital filter and the interpolation signal;
  a delay control signal generation circuit that receives the first and second signals output from said phase comparison circuit, outputs zero when the second signal indicates a match, and outputs a polarity of a value obtained by selecting a positive value or a negative value according to the delay or the advance indicated by the first signal and averaging selected values when the second signal indicates a mismatch; and
  a variable delay circuit that receives an output of said delay control signal generation circuit, and causes the delay of the second clock signal to be maintained without alteration, or variably controls a length of the delay.

7. The time-interleaved A/D converter device according to claim 6, wherein said delay control signal generation circuit comprises:
  a first selector that selects the positive value or the negative value according to the first signal;
  a filter that averages outputs of said selector;
  a circuit that extracts a sign of an output of said filter; and
  a second selector that performs selection between the sign of the output of said filter and zero according to a value of the second signal.

8. A time-interleaved A/D converter device comprising:
  first and second A/D converter circuits that receive an analog signal input in common, said first and second A/D converter circuits being driven by input first and second clock signals, respectively, the first clock signal for said first A/D converter circuit being used as the signal of a reference system and the second clock signal for said second A/D converter circuit being used as a signal to be adjusted;

first and second digital filters that perform filter processing on output signals of said first and second A/D converter circuits, respectively;

an interpolator that receives an output signal of said first digital filter, derives as an interpolation value a sampled value at a sampling time corresponding to the second clock signal having a predetermined phase difference with respect to the first clock signal, using sets of sampling times of the first clock signal and values of the input signal sampled by the first/D converter circuit at the sampling times, and outputs an interpolation signal;

a phase comparison circuit that receives the output signal of said first digital filter, an output signal of said second digital filter, and the interpolation signal output from said interpolator, outputs a first signal indicating a phase advance or a phase delay of the second clock signal responsive to a gradient of the input signal, and a second signal indicating whether the output signal of said second digital filter matches the interpolation signal or not, the phase delay or the phase advance of the second clock signal being obtained by the output signal of said second digital filter and the interpolation signal, the gradient of the input signal being derived from the output signals of said first and second digital filters;

a delay control signal generation circuit that receives the first and second signals output from said phase comparison circuit and outputs zero when the second signal indicates a match, and outputs a polarity of a value obtained by selecting a positive value or a negative value according to the delay or the advance indicated by the first signal and averaging selected values when the second signal indicates a mismatch; and a variable delay circuit that receives an output of said delay control signal generation circuit, and adjusts a length of the delay.

9. The time-interleaved A/D converter device according to claim 8, wherein said delay control signal generation circuit comprises:

a first selector that selects the positive value or the negative value according to the first signal;

a filter that averages outputs of said first selector;

a circuit that extracts a sign of an output of said filter; and a second selector that performs selection between the sign of the output of said filter and zero according to a value of the second signal.

* * * * *